United States Patent [19]

Yuyama et al.

[11] Patent Number: 5,184,072
[45] Date of Patent: Feb. 2, 1993

[54] APPARATUS FOR MEASURING WEAK STATIC MAGNETIC FIELD USING SUPERCONDUCTION STRIPS AND A SQUID MAGNETOMETER

[75] Inventors: Junpei Yuyama, 2-28-2, Morinosato, Atsugi-shi, Kanagawa-ken; Qiquan Geng, Green-haimu-Inui 2-304, 64, Yahata, Chigasaki-shi, Kanagawa-ken; Kazunori Chihara; Hirofumi Minami, both of Chigasaki; Eiichi Goto, Fujisawa, all of Japan

[73] Assignees: Research Development Corporation, Tokyo; Junpei Yuyama, Atsugi; Qiquan Geng, Ohigasaki, all of Japan; a part interest

[21] Appl. No.: 762,381

[22] Filed: Sep. 19, 1991

[30] Foreign Application Priority Data

Sep. 20, 1990 [JP] Japan .................................. 2-251494

[51] Int. Cl.⁵ ..................... G01R 33/02; G01R 33/035
[52] U.S. Cl. ..................................... 324/248; 505/845
[58] Field of Search ................ 324/248; 505/845, 846

[56] References Cited

U.S. PATENT DOCUMENTS 3,077,538  2/1963  Franzen ............................. 324/248

OTHER PUBLICATIONS

"The Use of Superconducting Shields for Generating Ultra-Low Magnetic Field Regions and Several Related Experiments," Chapter 4 Blas CABRERA: PH. D. Thesis, Stanford University (1975) pp. 84–117.
"Measurement of Absolute Intensity of Weak Magnetic Field Using Rf Biased SQUID" Cryogenics, vol. 20, No. 4, 1980 pp. 223–229.

Primary Examiner—Walter E. Snow
Attorney, Agent, or Firm—Oblon, Spivak, McClelland, Maier & Neustadt

[57] ABSTRACT

A magnetic field measurement system including a pick-up coil is not moved but fixed. Strips of superconducting material are arranged in a plane with narrow slits between the strips. The strips are moved very near the pick-up coil along the plane. From output variations of a SQUID magnetometer during the movement, a magnitude of a static field perpendicular to the plane of the strips is obtained.

6 Claims, 3 Drawing Sheets

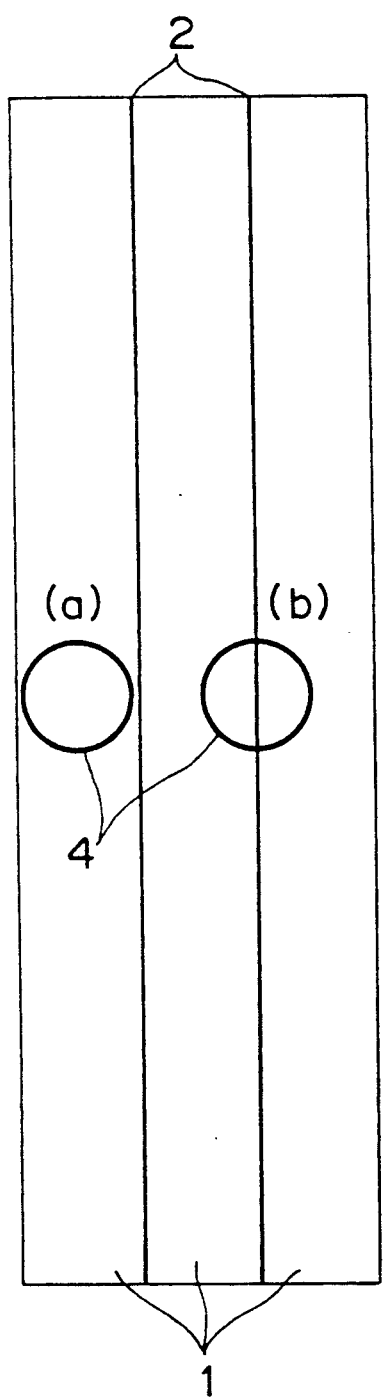

APPARATUS FOR MEASURING WEAK STATIC MAGNETIC FIELD USING SUPERCONDUCTION STRIPS AND A SQUID MAGNETOMETER

FIELD OF THE INVENTION

This invention relates to an apparatus for measuring a static weak magnetic field by using a superconducting quantum interference device(SQUID) as a magnetometer.

BACKGROUND OF THE INVENTION

It is required for circuits utilizing superconducting devices such as superconducting computers and bio-magnetic measurement apparatus to sufficiently shield the exterior earth field and other magnetic disturbances. To this end, high-performance feromagnetic shields and superconducting shields have been used. In order to test the performance of these shields, a very weak magnetic field of $nT(10^{-9}T)$ or less should be detected. This invention will provide means for effectively measuring such a weak magnetic field.

Although a flux gate magnetometer is used to measure very weak magnetic fields down to 0.1 nT, magnetic fields less than 0.1 nT can be detected only by the SQUID magnetometer. Variations of the magnetic field can be detected by the SQUID magnetometer with the accuracy of $fT(10^{-15}T)$, but an absolute value of a static magnetic field can not be measured in its nature. Cabrera (Doctorial thesis, Stanford University, 1975) has developed a method for obtaining an absolute value of a static magnetic field in which a pick-up coil is rotated and then an output variation of the SQUID magnetometer is detected. This method is called a flip coil method.

In the flip coil method, measurement should be carried out while the pick-up coil is rotating. Due to this, it is difficult to avoid output background variation derived from the rotation of the pick-up coil and its supporting mechanism. In order to resolve this problem, output variations are recorded while the pick-up coil is rotated by 360°C. Then the direction of the magnetic flux detection system itself is rotated by 180° around the axis of the rotation and then output variations are recorded again while the pick-up coil is rotated from the reversed position by 360°. As a result, differences between two output variations are regarded as net output variations generated by an external magnetic field. According to the method, the system is very complicated and the process is very difficult. Since magnitudes of the differences between two output variations are much smaller than those of two output variations, the S/N ratio is small.

SUMMARY OF THE INVENTION

In this invention, the magnetic field measurement system including the pick-up coil is not moved but fixed. Strips of superconducting material are arranged in a plane with narrow slits between the strips. The strips are moved very near the pick-up coil along the plane containing the strips. From output variations of the SQUID magnetometer during the movement, a magnitude of a static field perpendicular to the plane of the strips is obtained.

BRIEF EXPLANATION OF THE DRAWING

FIG. 2 is a plane view showing a relative position of a pick-up coil and superconducting strips.

DETAILED EXPLANATION OF THE EXAMPLE

Figure 1:
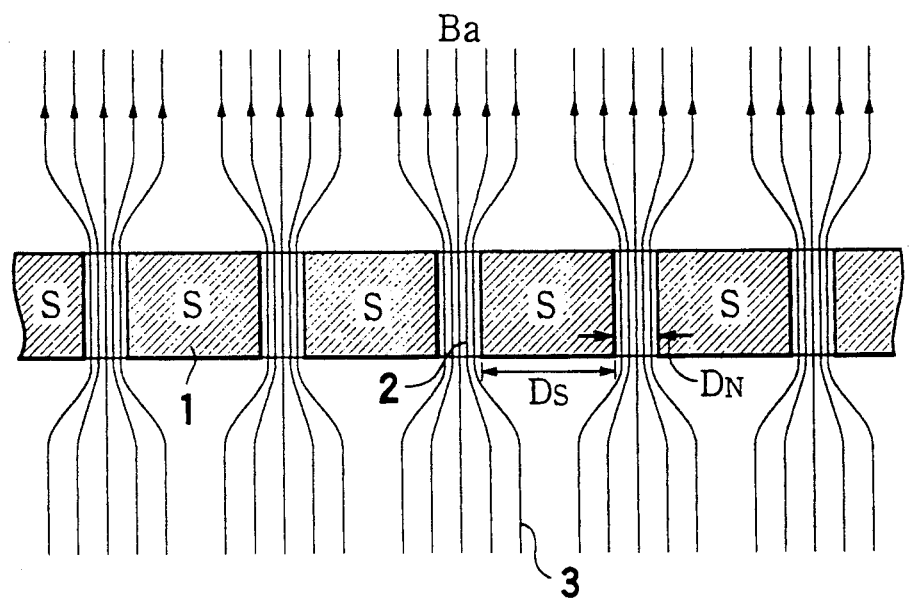
FIG. 1 is a cross sectional view of an array of superconducting strips.

First, we will explain the principle of this invention. FIG. 1 is a cross sectional view of an array of superconducting strips 1. The strips 1 are separated by narrow slits 2. Since magnetic force lines 3 which are applied on the array of the superconducting strips can not penetrate the superconducting strips 1, the magnetic force lines 2 are concentrated to the slits 3 and pass through them. Assuming that all the widths of the strips 1 are $D_S$, all the widths of the slits 2 are $D_N$ and the magnetic field perpendicular to the surface is $B_a$, then the amount of magnetic flux passing through the slits 2 per a unit length is $B_a(D_S+D_N)$.

Now we consider output variations when the pick-up coil 4 moves in parallel with and very near the surface of the strips 1. When the pick-up coil 4 is on the position a in FIG. 2, the amount of magnetic flux $\phi_{PC}$ passing through the pick-up coil is zero. When the pick-up coil 4 is on the position b in FIG. 2, the amount of passing magnetic flux $\phi_{PC}$ is $B_a(D_S+D_N)D_{PC}$, where $D_{PC}$ is the diameter of the pick-up coil. Therefore, periodic variations corresponding to the variations of the amount of the passing magnetic flux appears on the outputs of the SQUID magnetometer.

If an amplitude of the periodic variations of the output is obtained, the magnetic field perpendicular to the plane can be obtained since the widths $D_S$ of the strips 1, the widths $D_N$ of the slits 2 and the diameter $D_{PC}$ of the pick-up coil 4 are known.

Figure 3:
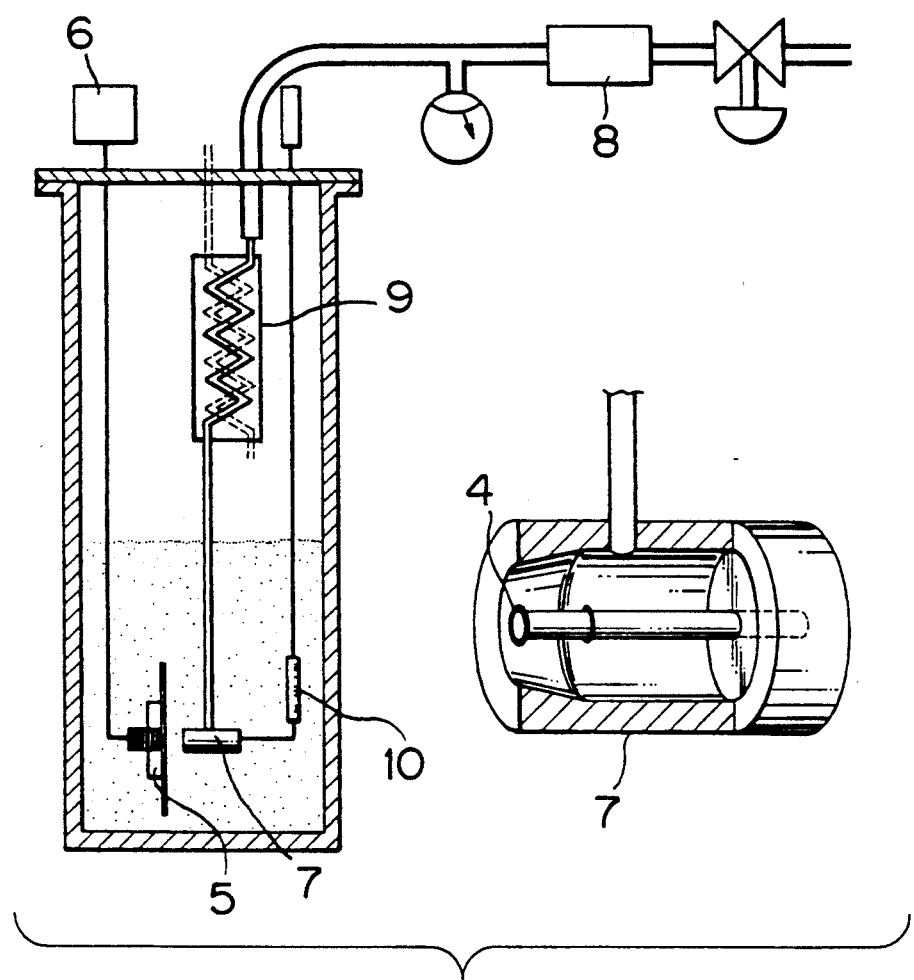
FIG. 3 is a schematic diagram of an example of measuring system according to this invention.

FIG. 3 shows an example of apparatus for measuring a static magnetic field according to this invention. The apparatus is wholly encapsulated in a triple Parmalloy magnetic shield (not shown). A wafer holder 5 which holds a wafer having an array of strips of a superconducting film can be moved up and down and rotated by a driver 6. A pick-up coil 4 is mounted on a floating head 7. Helium gas supplied from a high-pressure bomb (not shown) passes through a flow rate controller 8 and a heat exchanger 9, and then it is spouted from a center spout hole to make a radial flow. By means of the radial flow, the distance between the floating head 7 and the wafer is made constant. The mechanism of the hydrodynamic suspension has been disclosed in U.S. Pat. application Ser. No. 494,987 filed on Mar. 16, 1990. A pick-up coil 4 is magnetically coupled to a SQUID magnetometer 10.

In the above descriptions, it is asummed that the widths $D_S$ of the strips are larger than the diameter $D_{PC}$ of the pick-up coil ($D_S>D_{PC}$), thus the number of the slits 2 just under the pick-up coil 4 is one or two. In this example, an array of strips 400 μm wide and slits 5 μm wide is used while the diameter of the pick-up coil is 1 mm. Therefore, the number of the slits just under the pick-up coil 4 is two or three. It is possible to obtain a similar relation by slightly modifying the above described relation between the passing amount of the magnetic flux and the perpendicular magnetic field $B_a$.

Figure 4:
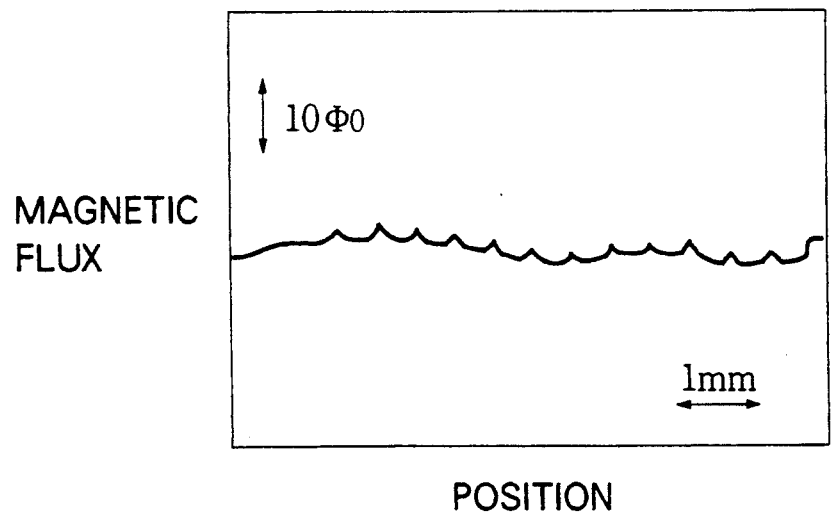
FIG. 4 is a graph showing periodic variations of output signals.

The periodic variations of the amount of the passing magnetic flux $\phi_{PC}$ which are obtained by actually measuring the outputs of the SQUID are shown in FIG. 4. The magnitude of the perpendicular magnetic field $B_a$ is estimated at 14 nT from the thirteen small peaks which periodically appear at the same intervals. The large undulation appearing over the measured signal is a background signal caused by the sample holding and moving mechanisms.

In this example, the hydrodynamic floating head 7 is used, but any similar mechanism can be used so long as it can move the wafer while maintaining the distance between the wafer and the pick-up coil. In this example, only the magnetic field perpendicular to the wafer surface is measured, but two or three directional components of the magnetic field can be detected by changing the direction of the apparatus or using a plurality of these apparatuse.

This invention resolves the defect that the SQUID magnetometer can not detect the absolute value of the magnetic field, and thus it is a very useful means for measuring the absolute value of a weak magnetic field with high sesitivity.

As compared with the prior art flip coil method, this invention has the following advantages. Since in the flip coil method, measurement is divided into two processes which are interposed by reversing the rotation axis of the coil by 180° and the results from the two processes are subtracted, it is hard to eliminate the output variations resulting from the rotation of the pick-up coil itself so that the measurement accuracy decreases. In contrast, in this invention the magnetic flux measuring system including the pick-up coil can be fixed. Even if outputs of origins other than the magnetic flux passing through the slits vary, it is easy to separate the periodic output variations which have intervals of the sum of the strip width $D_S$ and the slit width $D_N$ from the output signal. This invention is very adequate for high S/N measurement.

What is claimed is:

1. An apparatus for measuring a weak static magnetic field, including a superconducting quantum interference device (SQUID) and a pick-up coil magnetically coupled thereto, said apparatus comprising:
   an array of superconducting strips which are arranged in a plane and separated by narrow slits, and
   means for moving said array in a direction parallel to the plane and at a small distance from the pick-up coil.

2. The apparatus according to claim 1, wherein said pick-up coil is fixed with respect to said moving array.

3. The apparatus according to claim 1, further comprising a means for measuring output variations from said superconducting quantum interference device (SQUID), and thereby obtaining a magnitude of said magnetic field perpendicular to said plane.

4. The apparatus according to claim 1, wherein said array of superconducting strips are disposed within a wafer holder which is moved with respect to said pick-up coil by a driving means.

5. The apparatus according to claim 1, wherein said pick-up coil is mounted on a floating head.

6. The apparatus according to claim 1, wherein said superconducting quantum interference device (SQUID) detects an absolute value of said magnetic field.

* * * * *